United States Patent [19]

Zitz et al.

[11] Patent Number: 4,537,447
[45] Date of Patent: * Aug. 27, 1985

[54] DEVICE FOR COOLING THE BITS OF CUTTING MACHINE

[75] Inventors: Alfred Zitz; Otto Schetina; Herwig Wrulich, all of Zeltweg, Austria

[73] Assignee: Voest-Alpine Aktiengesellschaft, Vienna, Austria

[*] Notice: The portion of the term of this patent subsequent to Mar. 26, 2002 has been disclaimed.

[21] Appl. No.: 382,650

[22] Filed: May 27, 1982

[30] Foreign Application Priority Data

Jun. 4, 1981 [AT] Austria ................. 2519/81

[51] Int. Cl.³ ............................ E21C 35/22
[52] U.S. Cl. ......................... 299/1; 299/17; 299/81
[58] Field of Search ............ 299/81, 17, 1; 175/317; 251/320, 323, 118, 321

[56] References Cited

U.S. PATENT DOCUMENTS

| | | | |
|---|---|---|---|
| 1,022,851 | 4/1912 | Knack | 251/320 X |
| 1,365,369 | 1/1921 | Boyce | 251/320 |
| 2,001,487 | 5/1935 | Doherty | 251/323 X |
| 3,025,871 | 3/1962 | Roth et al. | 251/118 X |
| 3,536,095 | 10/1970 | Demeter et al. | 251/321 X |
| 3,853,300 | 12/1974 | Bryntse et al. | 251/321 X |
| 4,333,687 | 6/1982 | Barnstorf | 299/17 X |

FOREIGN PATENT DOCUMENTS

| | | | |
|---|---|---|---|
| 0010534 | 4/1980 | European Pat. Off. | 299/1 |
| 0040334 | 11/1981 | European Pat. Off. | 299/81 |
| 0621873 | 8/1978 | U.S.S.R. | 299/81 |
| 0685821 | 9/1979 | U.S.S.R. | 299/81 |

*Primary Examiner*—James A. Leppink
*Assistant Examiner*—Beverly E. Hjorth
*Attorney, Agent, or Firm*—Cushman, Darby & Cushman

[57] ABSTRACT

For cooling the bits (1) of a cutting machine, nozzles (22) for cooling water are provided. The bit (1) is supported for axial shifting movement and can when being loaded exert a stroke for the path (a) in direction of the arrow (4). A coupling member (9) transmits the movement of the bit (1) to a shutoff valve (7) blocking the supply of water in unloaded condition of the bit and giving free the supply of water whenever a predetermined cutting pressure is exceeded. The restoring force of the bit (1) to return the same in its starting position in unloaded condition is provided by a spring (5) and by the water pressure and is rated in correspondence with the minimum value of the cutting pressure. The restoring spring (5) is supported against an adjustable abutment (30, 31) which can be fixed in position during operation so that the restoring force can be adjusted.

4 Claims, 2 Drawing Figures

DEVICE FOR COOLING THE BITS OF CUTTING MACHINE

The invention refers to a device for cooling the bits of a cutting machine comprising a nozzle, arranged at the area of the bit, for the cooling water to be ejected under pressure and to which nozzle the water supply can be interrupted by means of a shutoff valve, the bit being supported on the bit holder for limited axial shifting movement under the action of the cutting pressure against a restoring force provided by the force of a spring and the water pressure and the shutoff valve being coupled with the bit by a coupling member such that it opens on a shifting movement of the bit in direction of the cutting pressure. The bits are, for example, arranged on a cutting head or on a cutting roll. The device described above is provided for each bit or for only that bit which is subjected to higher stress.

It is an object of the invention to still further reduce the water consumption of such a device and essentially consists in that the restoring force loading the bit in opposite direction to the cutting pressure is rated such that this restoring force is only overcome with a uniaxial cubic compression strength of the rock to be cut of at least 20 N/mm².

Cooling of the bit by means of a water jet is above all of importance for avoiding the generation of sparks. Such a formation of sparks results, particularly with cutting of coal, in explosion hazard. The invention is now based on the recognition that any danger of spark generation exists only with harder rock while when cutting softer rock spark generation is not to be expected.

In case of rock of high hardness or strength, the bit is loaded with a higher cutting pressure than when cutting soft rock. It is only if the restoring force acting on the bit in opposite direction to the cutting pressure is overcome that the valve opens and cooling water is ejected onto the bit and the cutting face. This restoring force is, according to the invention, rated such that it is only overcome by the cutting pressure if the bit hits rock of a predetermined strength, i.e. a uniaxial cubic compression strength of at least 20 N/mm². Thus, the time interval for ejecting cooling water from the nozzle is limited to those time intervals during which the bit hits rock of high strength and cooling and, therewith, water consumption is reduced to the extend required for avoiding spark generation.

According to the invention, the restoring force is preferably at least 3000 N.

According to a preferred embodiment of the invention, the spring can be supported against an adjustable abutment which can be fixed in position during operation. In this manner, the restoring force can be adapted to different values of cubic compression strength thereby taking into consideration the rock just to be cut. In an arrangement, in which the spring is in a manner known per se formed of a helical spring acting on the valve cone and being coaxially arranged therewith, the abutment can be formed of a spring collar screwed into the valve housing or into the bit holder.

The arrangement is preferably such that the shutoff valve is in a manner known per se, provided with a valve cone opening in opposite direction to the direction of flow of the water and comprising a valve shaft sealingly guided within the valve housing and that a piston sealingly guided within a cylinder and arranged downstream of the valve cone is rigidly connected with this valve cone, at least one outlet opening for the water opening into a space located between the valve cone and the piston. The pressure of the water upstream the nozzle is for the purpose of obtaining a sharp jet conveniently selected relatively high and can assume a value of 200 bar or even more. On account of the cone valve opening in direction opposite to the direction of flow, this pressure would with the valve assuming open position act on the valve cone in the opening sense. A very high spring force and thus a strong spring would be necessary for overcoming this pressure and for closing the valve and such a strong spring would require to increase the dimensions of the construction. In view of a piston sealingly guided within a cylinder being rigidly connected with the valve cone, the pressure acting within the space downstream of the valve cone is acting on the valve cone only at the area of an annular surface, the surface extent of which corresponds to the difference between the cross section of the valve shaft and the cross section of the piston. This results in the possibility to design the spring loading the valve cone as a weeker spring of reduced overall dimensions. If the diameter of the piston is equal the diameter of the valve shaft, the pressure of the water acting on the valve cone is compensated in open position of the valve, so that in open position of the valve the restoring force is only defined by the force of the spring. According to a preferred embodiment of the invention, the diameter of the piston is, however, greater than the diameter of the shaft of the valve cone. With the valve assuming open position, the water pressure acts on an annular surface, the surface extent of which corresponds to the cross section of the piston reduced by the cross section of the valve shaft. The restoring force acting on the valve cone of the opened valve in the sense of closing same is thus the sum of the spring force and of the force resulting from the water pressure acting on said annular surface. With the valve assuming closed position, the water pressure prevailing upstream the valve is acting on an annular surface, the surface extent of which corresponds to the cross section of the edge of the seat surface of the cone valve reduced by the cross section of the valve shaft. This annular surface is greater than the surface corresponding to the cross section of the piston reduced by the cross section of the valve shaft, so that the restoring force which must be overcome by the bit when opening the valve is greater than the restoring force required during closing the valve. Thus the valve will open at a greater cutting pressure and will close at a somewhat lower cutting pressure. This prevents fluttering of the valve.

In the drawing, the invention is schematically illustrated by an embodiment.

Figure 1:
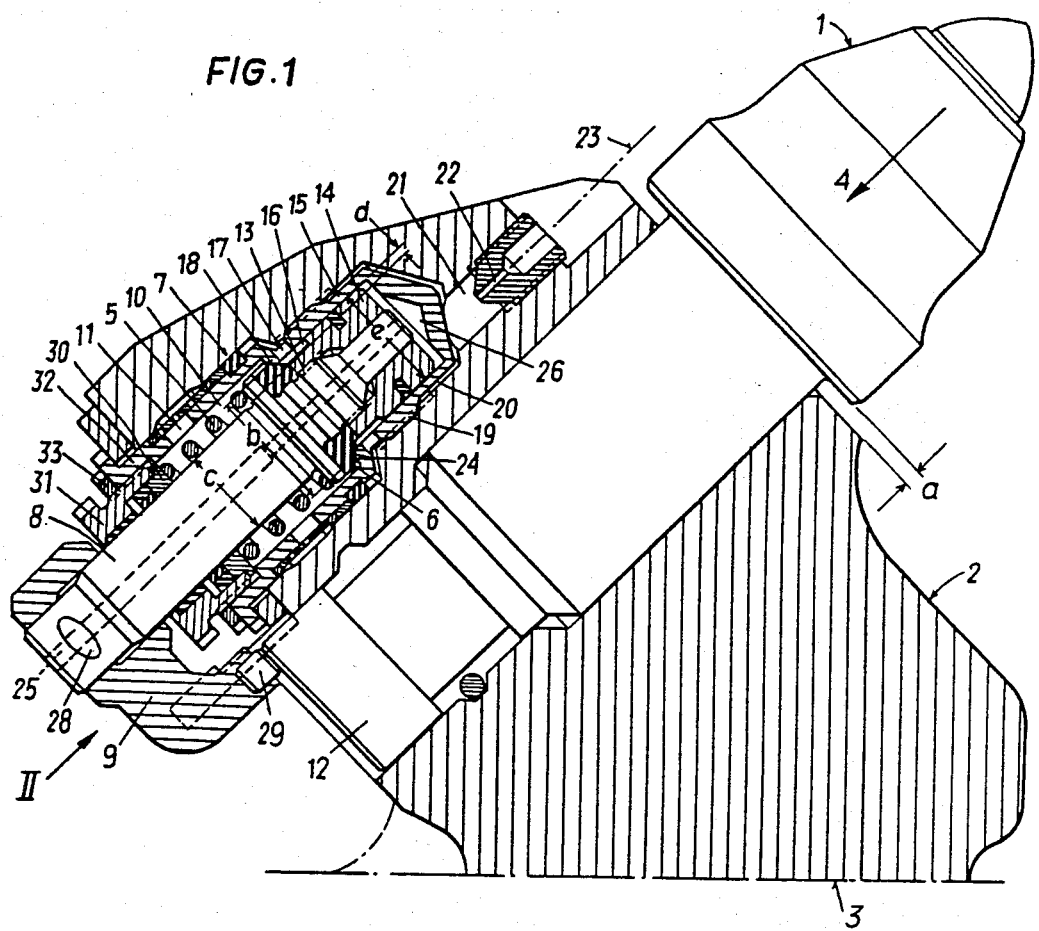
FIG. 1 shows a section through the bit holder and through the valve along the axis of the bit and of the valve and along line I—I of FIG. 2.
Figure 2:
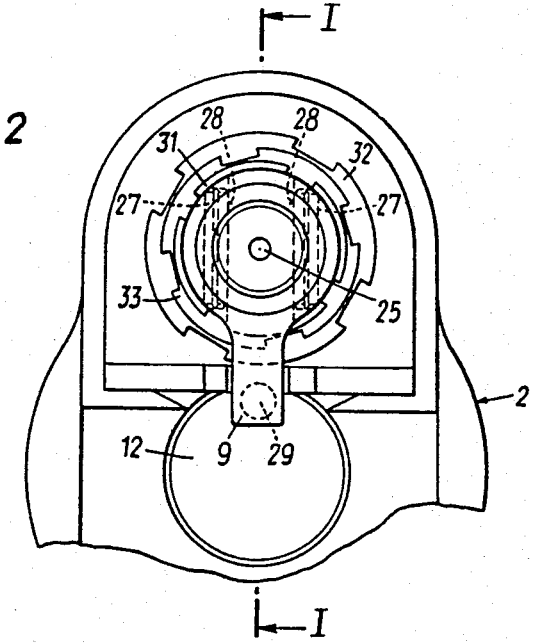
FIG. 2 shows a view in direction of arrow II of FIG. 1.

The bit 1 is supported within the bit holder 2 for being axially shifted along a path a. 3 is the surface of the bit holder along which the bit holder is welded to the cutting head. The bit 1 is loaded by a spring 5 in direction opposite to the cutting pressure acting in direction of arrow 4. This spring 5 is acting on the valve cone 6 of a valve 7 and a finger 9 is connected with the shaft 8 of the valve cone 6 and is pressing on the shaft 12 of the bit 1 and thus loading this bit in opposite direction to the cutting pressure acting in direction of arrow 4. Pressurized water is supplied to the space 10 located upstream the valve cone 6 through openings 11 and via channels not shown provided within the cutting head and within the bit holder and is thus acting on the valve cone in the sense of closing same, i.e. in the same direction as the spring 5. The force acting on the bit 1 via the finger 9 and in opposite direction to the cutting pressure acting in direction of arrow 4 is thus composed of the force of the spring 5 and the force generated by the water pressure and the sum of these forces must be so great that the bit is overcoming this force only if it hits rock having a uniaxial cubic strength of at least 20 N/mm$^2$ and thus lifts the valve cone 6 off its seat.

A piston 14 is connected with the valve cone 6 by means of a thread 13 and is sealingly guided within a cylinder 15. A space 16 is provided by an indent between the valve cone 6 and the piston 14 and outlet openings 17 for the water are opening into this space. If the valve cone 6 is lifted off the seat 18, the pressurized water flows from the space 10 into the space 16, from there through outlet openings 17 and over grooves (not shown) within the thread 19 (with which the cylinder 15 is fixed within the bit holder) and through a slot 20 provided between the cylinder and the bore of the bit holder to the space 21 located upstream the nozzle 22 and is ejected from the nozzle in a sharp jet 23 against the cutting face at the area of the bit 1. The water pressure within the space 21 is comparatively high and assumes a value of for example 200 bar, so that a sharp jet 23 is formed.

If the valve is closed, i.e. if the valve cone 6 rests on the valve seat 18, the water pressure prevailing within the space 10, acts on an annular surface, the surface extent of which corresponds to the cross section b of the outer edge of the valve seat 18 reduced by the cross section c of the valve shaft 8. The valve opens as soon as the force exerted by the water pressure on the valve cone 6 and the added force of the spring 5 is overcome by the cutting pressure acting in direction of the arrow 4.

As soon as the valve cone 6 is lifted off the valve seat 18, a water pressure is generated within the space 16, said water pressure corresponding to the pressure prevailing within the space 10 and reduced by the pressure drop of the flowing medium. With the valve in open position, this water pressure acts on an annular surface d, the surface extent of which corresponds to the cross section e of the piston 14 reduced by the cross section c of the valve shaft 8. In view of the cross section c of the valve shaft 8 being smaller than the cross section e of the piston 14, this force acts in the sense of closing the valve. The restoring force acting with the valve cone 6 lifted in the sense of closing the valve and in direction opposite to the cutting pressure acting in direction of arrow 4, is thus composed of the force of the spring 5 and of the force resulting from the water pressure acting on the annular surface d. In view of the annular surface being smaller than the cross section b of the outer edge 24 of valve seat 18 reduced by the cross section c of the valve shaft 8, the restoring force exerted in open position of the valve by the water pressure is smaller than the restoring force exerted in closed position of the valve. Thus, the cutting pressure of the bit at which the valve 7 opens is greater than the cutting pressure of the bit at which the valve 7 closes thereby avoiding fluttering of the valve 7 and thus also fluttering of the bit 1.

The abutment of the spring 5 is formed of a spring collar 30, 31 being screwedly engageable within the valve housing 32. If this spring collar is further screwed into the valve housing, the spring 5 becomes more prestressed and the restoring force becomes greater. In the corresponding position, the spring collar 30, 31 can be fixed in position by a tightening nut 33. The restoring force becomes thus adjustable.

25 is a bore provided within the valve shaft and opening into atmosphere and via which the space 26 above the piston 14 is depressurized. 27 are wedges engaging grooves 28 of the valve shaft 8 and connecting the valve shaft 8 with the finger 9. 29 is a pressure member via which the finger 9 acts on the bit shaft 12.

What is claimed is:

1. A device for cooling the bits of a cutting machine comprising a nozzle, arranged adjacent the bit, for the cooling water to be ejected under pressure and to which nozzle the water supply can be interrupted by means of a shutoff valve assembly which includes a valve member movable within a valve housing, the bit being supported on a bit holder for limited axial shifting movement under the action of the cutting pressure against a restoring force provided by the force of a spring and the water pressure and the shutoff valve assembly being coupled with the bit by a coupling member such that the shutoff valve opens on a shifting movement of the bit in direction of the cutting pressure, the device being characterized in that the restoring force loading the bit in opposite direction to the cutting pressure is rated such that this restoring force is at least 3000 N and is only overcome with a uniaxial cubic compression strength of the rock to be cut of at least 20 N/mm$^2$, the spring being supported against an adjustable abutment so that restoring force can be adjusted.

2. Device as claimed in claim 1, characterized in that the spring is a helical spring acting on the movable valve member and is coaxially arranged therewith and in that the abutment is formed of a spring collar screwed into the valve housing or into the bit holder.

3. Device as claimed in claim 1, characterized in that the movable valve member is a valve cone which opens in opposite direction to the direction of flow of the water, said valve member comprising a valve shaft sealingly guided within the valve housing and in that a piston sealingly guided within a cylinder and arranged downstream of the valve cone is rigidly connected with this valve cone, at least one outlet opening for the water opening into a space located between the valve cone and the piston.

4. Device as claimed in claim 3, characterized in that the diameter of the piston is greater than the diameter of the shaft of the valve cone.

* * * * *